(12) United States Patent
Woodside et al.

(10) Patent No.: US 7,078,098 B1
(45) Date of Patent: Jul. 18, 2006

(54) COMPOSITES COMPRISING FIBERS DISPERSED IN A POLYMER MATRIX HAVING IMPROVED SHIELDING WITH LOWER AMOUNTS OF CONDUCIVE FIBER

(75) Inventors: Andrew Bencich Woodside, Pickerington, OH (US); Dale Edwin McCoy, Granville, OH (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 09/607,864

(22) Filed: Jun. 30, 2000

(51) Int. Cl.
*B32B 27/04* (2006.01)
*B32B 19/00* (2006.01)
*B32B 15/00* (2006.01)
*B32B 9/00* (2006.01)
*D04H 1/00* (2006.01)

(52) U.S. Cl. ............... 428/378; 428/292.1; 428/293.1; 428/296.7; 428/297.1; 428/300.7; 428/301.4; 428/357; 428/379; 428/407; 428/375; 428/359; 428/367; 428/392

(58) Field of Classification Search ............ 428/292.1, 428/293.1, 296.7, 297.1, 300.7, 301.4, 357, 428/378, 379, 407, 375, 359, 367, 392
See application file for complete search history.

(56) References Cited

U.S. PATENT DOCUMENTS

| | | | |
|---|---|---|---|
| 3,940,357 A | 2/1976 | Fahey | |
| 4,356,228 A * | 10/1982 | Kobayashi et al. | ......... 428/283 |
| 4,479,998 A | 10/1984 | Belbin et al. | |
| 4,530,779 A | 7/1985 | Mayama et al. | |
| 4,549,920 A | 10/1985 | Cogswell et al. | |
| 4,559,262 A | 12/1985 | Cogswell et al. | |
| 4,566,990 A | 1/1986 | Liu et al. | |
| 4,622,266 A | 11/1986 | Kim | |
| 4,664,971 A | 5/1987 | Soens | |
| 4,752,415 A * | 6/1988 | Iwaskow et al. | ............ 252/511 |
| RE32,772 E | 10/1988 | Hawley | |
| 4,808,481 A | 2/1989 | Luxon | |
| 4,818,615 A | 4/1989 | Luxon et al. | |
| 4,882,089 A * | 11/1989 | Iwaskow et al. | ............ 442/229 |
| 4,944,965 A | 7/1990 | Luxon et al. | |
| 4,960,642 A * | 10/1990 | Kosuga et al. | ............... 428/407 |
| 4,983,456 A * | 1/1991 | Iwaskow et al. | ............ 442/229 |
| 5,019,450 A | 5/1991 | Cogswell et al. | |
| 5,171,634 A | 12/1992 | Soszka et al. | |
| 5,213,889 A | 5/1993 | Cogswell et al. | |
| 5,229,202 A | 7/1993 | Tomono et al. | |
| 5,302,661 A | 4/1994 | Bastiaansen | |
| 5,387,468 A | 2/1995 | Pollet et al. | |
| 5,397,608 A | 3/1995 | Soens | |
| 5,451,355 A | 9/1995 | Boissonnat et al. | |
| 5,611,836 A | 3/1997 | Moireau | |
| 5,664,041 A | 9/1997 | Szum | |
| 5,911,932 A | 6/1999 | Dyksterhouse | |
| 5,972,499 A | 10/1999 | Rodriguez et al. | |

FOREIGN PATENT DOCUMENTS

| | | |
|---|---|---|
| EP | 0 283 844 | 9/1988 |
| JP | 63 230769 A | 9/1988 |
| JP | 09 087528 A | 3/1997 |
| WO | WO 98/06551 | 2/1998 |

OTHER PUBLICATIONS

Copy of translation of Japanese Patent No. 63-230769, previously submitted on Oct. 16, 2000.

* cited by examiner

*Primary Examiner*—Rena Dye
*Assistant Examiner*—Lawrence Ferguson
(74) *Attorney, Agent, or Firm*—John A. Molnar, Jr.

(57) ABSTRACT

The present invention relates to composites useful for shielding electromagnetic radiation and their manufacture. In general, the composites of the present invention comprise conductive fibers which are highly dispersed in a polymer matrix. The invention also relates to pellets and their manufacture. Such pellets are useful in the manufacture of composites comprising highly dispersed conductive fibers in a polymer matrix.

19 Claims, 1 Drawing Sheet

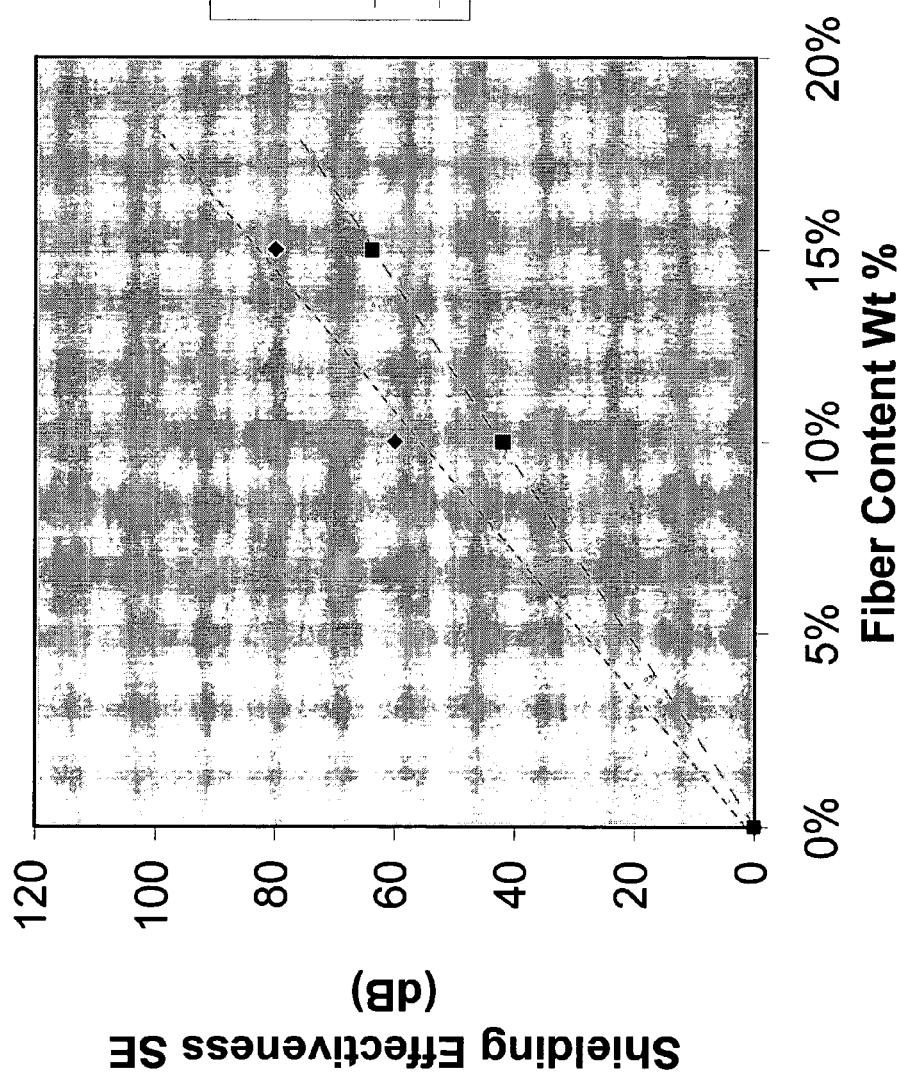

COMPOSITES COMPRISING FIBERS DISPERSED IN A POLYMER MATRIX HAVING IMPROVED SHIELDING WITH LOWER AMOUNTS OF CONDUCIVE FIBER

FIELD OF THE INVENTION

The present invention relates to composites useful for shielding electromagnetic radiation and their manufacture. In general, the composites of the present invention comprise conductive fibers which are highly dispersed in a polymer matrix. The invention also relates to pellets and their manufacture. Such pellets are useful in the manufacture of composites comprising highly dispersed conductive fibers in a polymer matrix.

BACKGROUND OF THE INVENTION

The increased usage of electronic equipment such as computers and other digital devices has lead to a concern for the hazards associated with electromagnetic radiation such as radar waves, microwaves, and electromagnetic radiation produced by electronic circuits. Because of these concerns, electromagnetic shielded composites have been developed to: 1) protect the user of an electronic device, 2) protect an electronic device, and 3) protect surrounding electronic devices. As the electronic industry grows there in an increasing need for improved electromagnetic shielded materials which may be incorporated into electronic products.

Plastic articles formed with electrically conductive materials are particularly convenient as compared to traditional metal materials because they are light weight, easily produced using injection molding techniques, and of low cost. Typically these electrically conductive materials are composites of plastics and conductive fibers.

Various conventional techniques have been employed when incorporating electrically conductive fibers into a polymer matrix to make electromagnetic shielded composites. A drawback to these techniques is their inability to provide for adequate dispersions of conductive fibers within the composites. A technique which yields poor dispersions of conductive fibers in a composite requires the use of larger amounts of fibers in order to obtain effective electromagnetic shielding. To solve this problem, conventional techniques have employed several mechanical means to intimately mix conductive fibers a polymer to make a composite product. Unfortunately, the mechanical mixing of conductive fibers with a polymer is stressful and causes damage to the fibers such as fracture or breakage. These damaged fibers impart reduced electromagnetic shielding properties due to their reduced ability to conduct electricity through the composite article.

An example of a basic technique for making an electromagnetic shielded composite involves heating a thermoplastic to a molten temperature and then kneading in the conductive powders fibers. Unfortunately, when kneading conductive fibers with a molten thermoplastic, the fibers are often broken due to the cutting action by the kneading screw and by the shearing of the resin. These fibers are broken into smaller and smaller segments such that the resulting composite article contains only shorter length broken fibers. Such shortened fibers impart reduced electromagnetic shielding properties to the composite article due to their reduced ability to conduct electricity through the composite article. Composite articles formed with broken fibers require the use of higher amounts fiber and may lead to embrittlement of the composite article thus formed. Additionally, operators working directly with the cut fibers and powders can experience pain or itchiness in handling the materials.

To avoid the problems with directly mixing in cut fibers, attempts have been made to provide electromagnetic shielding plastic compound pellets by impregnating conductive fibers with a polymer and then cutting the impregnated fiber into pellet form. An example of such a process involves the use of continuous lengths of filaments which are passed through a bath containing a molten resin whereby such filaments become impregnated with the polymer. Once the filaments are impregnated they are continuously withdrawn from the bath, commingled either before or after passage through a heat source and cooled to solidify the molten resin around the fibers. These impregnated fibers are then cut to form pellets which are then formed into composite articles. Another example of an impregnation technique involves the use of a conductive tow comprised of a plurality of strands. The tow is mechanically splayed allowing for the impregnation of a polymer between the strands and then the strands subsequently gathered together into an impregnated tow which is cooled and chopped into pellets. There are various disadvantages to these impregnation techniques. One disadvantage is that impregnation techniques are relatively slow and cumbersome. Additionally, impregnation techniques often do not provide adequate integration of polymer and fiber. Impregnated fibers often fray when cut into pellets and can become separated from the resin. When consolidated into a composite, pellets made by impregnation techniques often provide an inadequate dispersion of fibers and poor electromagnetic shielded ability. It is believed this is due, at least in part, to the inadequate integration of polymer and fiber resulting from impregnation techniques.

A possible solution to the problems associated with impregnation techniques is to encase or coat fibers with a polymer sheath. For example, U.S. Pat. No. 4,530,779 to Mayama et al., discloses initially coating a strand of fibers with a coupling agent and subsequently coating the strand with a polymer. The coated strand is then chopped into pellets. Other attempts at forming electromagnetic shielded articles have passed electrically conductive fiber strands through a bath of a polymeric material to first impregnate the fibers. These impregnated strands are then encased with a second polymeric material as exemplified by U.S. Pat. No. 4,664,971 and U.S. Pat. No. 5,397,608 both to Soens. The encased strands are then chopped into pellets. A disadvantage of the aforementioned methods exemplified by Mayama et al. and Soens is that these methods produce pellets, which by themselves, are not adequate to form an electromagnetic shielded composite. Additional polymer material must be added to the pellets resulting in an additional mixing step which often causes mechanical damage such as fracture or breakage of conductive fibers. Mechanical damage to the conductive fibers results in a composite with poor electromagnetic shielding. Another method, as described in U.S. Pat. No. 4,960,642 to Kosunga et al., discloses impregnating conductive fibers with an oligomer and encasing the resulting impregnated bundled fibers in a polymer. The encased bundled fibers are then chopped into pellets. A major drawback to the method of Kosunga et al. is that the fibers must be impregnated under pressure.

Accordingly, there is a long felt need in the art for a method which provides an adequate dispersion of electrically conductive fibers in a polymer matrix to make an electrically shielded composite. The present invention provides for such a method without any of the disadvantages identified in conventional methods as exemplified above. Unlike conventional methods, the present invention provides for a composite with improved electrical shielding properties and avoids undesirable mechanical damage to conductive fibers. The present invention also provides for pellets, which by themselves, may be consolidated into an electrically shielded composite and avoids the undesirable step of mixing additional polymer material to the pellets. Furthermore, the present invention avoids the complex and/or cumbersome impregnation techniques found in conventional methods.

SUMMARY OF THE INVENTION

An object of this invention is electromagnetic shielded composites and their manufacture where the composites comprise highly dispersed conductive fibers in a polymer matrix. Another object of this invention is pellets, which by themselves, are useful in forming electromagnetic shielded composites comprising highly dispersed conductive fibers. The pellets comprise a conductive fiber core, a chemical treatment, and a sheathing polymer.

According to the invention, pellets are made by subjecting an electrically conductive strand to a chemical treatment thereby creating a chemically treated strand. The chemically treated strand is then encased in a polymer sheath thereby creating a sheathed strand. The sheathed strand is then chopped into pellets.

The sheathed strand is then chopped into pellets, which without any need of additional polymer, may be consolidated into an electromagnetic shielding composite. The pellets preferably have an average diameter of from 2 mm to 12 mm.

The electrically conductive strand comprises a plurality of gathered fibers which are in turn composed of any material which is electrically conductive. The gathered fibers may be composed entirely of metal, metal alloys, or an electrically conductive polymer. The gathered fibers may also comprise organic or inorganic fibers which have been coated, plated, or otherwise treated so that the fibers are electrically conductive. Preferably, the conductive strand comprises at least 40 gathered fibers.

At most the final polymer sheathed pellet should comprise no more than 8 wt % of the chemical treated and preferably no more than 5 wt %. Amounts greater than 8 wt. % may lead to problems such as off gassing and drool during injection molding. Preferably, the chemical treatment comprises an organic material in liquid form (aqueous or preferably non-aqueous) having a viscosity not higher than 1500 cps, preferably not higher than 800 cps, and more preferably not higher than 200 cps, at a temperature range of 80°–180° C. The organic material of the chemical treatment should also be compatible with the polymer sheath. Preferably, the chemical treatment comprises an organic monomer or oligomer have a degree of polymerization less than 20. Examples of suitable organic materials which comprise the chemical treatment of this invention include: bisphenol A, propoxylated bisphenol A, diphenyl ether, diphenyl sulfone, stilbene, diglycidyl ether of bisphenol A, triglycidylisocyanurate, citric acid, pentaerythritol, dicyandiimide, 4,4'-sulfonyldianiline, 3,3'-sulfonyldianiline, stearate-capped propyleneglycol fumarate oligomer, butoxyethylstearate, ethylene carbonate, sorbitan monostearate, hydrogenated vegetable oil.

The chemical treatment may be applied by conventional means known in the art. Preferably a strand of conductive fibers is towed across a bath comprising the chemical treatment which is heated to between 80–180° C. to obtain a viscosity not higher than 1500 cps, preferably not higher than 800 cps, and more preferably not higher than 200 cps. Preferably, the strand is first heated before introduction to the bath in order to promote the wicking of the chemical treatment into the interstices thereof. Although not preferable, the chemical treatment may be applied using the methods set forth in U.S. patent application Ser. No. 08/695,504 and U.S. patent application Ser. No. 08/695,909 both of which are hereby fully incorporated by reference. Accordingly, the chemical treatment may be applied to individual fibers which are then gathered to form an impregnated strand which is subsequently encased in a sheathing polymer.

The polymer sheath may comprise any polymer such as thermoset or thermoplastic polymers. If the chemically treated strand is encased in a thermoset polymer, the thermoset polymer is left uncured or partially cured. The thermoset polymer should be convertible by heat or light, alone or in combination with catalysts, accelerators, cross-linking agents, etc., to form the electronic shielded composites of the invention. By way of illustration, some of the polymers useful as a polymer sheath of the invention include: polyesters, polyethers, polycarbonates, epoxies, phenolics, epoxy-novolacs, epoxy-polyurethanes, urea-type resins, phenol-formaldehyde resins, melamine resins, melamine thiourea resins, urea-aldehyde resins, alkyd resins, polysulfide resins, vinyl organic prepolymers, multifunctional vinyl ethers, cyclic ethers, cyclic esters, polycarbonate-coesters, polycarbonate-co-silicones, polyetheresters, polyimides, bismalemides, polyamides, polyetherimides, polyamideimides, polyetherimides, and polyvinyl chlorides. The polymeric material may be present alone or in combination with copolymers, and compatible polymeric blends may also be used. In short, any conventional polymeric material may be selected and the particular polymer chosen is generally not critical to the invention. Preferred polymers are polycarbonate, acrylonitrile butadiene styrene, polycarbonate acrylonitrile butadiene styrene copolymer, polybutylene terephthalate, styrene, polypropylene, and nylon.

The sheathing polymer is applied to a chemically treated strand so that the strand is thoroughly coated with the polymer resulting in a material comprising a core of chemically treated conductive strand encased in a polymer sheath of relatively uniform thickness. Conventional wire coating methods may be employed to encase the chemically treated strands of this invention. Such methods include passing a chemically treated strand into a single hole extrusion die which is supplied with molten polymer to encase the strand. Preferable wire coating methods are those described in U.S. patent application Ser. No. 08/695,504 and U.S. patent application Ser. No. 08/695,909 both of which are hereby fully incorporated by reference.

Once a chemically treated strand is encased with a polymer sheath, it may be chopped into pellets which may be consolidated into a electromagnetic shielded composite without the need of any additional polymer or other ingredients. Any conventional chopper may be used with the present invention.

BRIEF DESCRIPTION OF THE DRAWING

FIG. 1 shows a comparison of the electromagnetic shielding properties of composites made with conventional methods as compared to composites which may be obtained according to the present invention.

DETAILED DESCRIPTION OF THE INVENTION

The electromagnetic shielding composites of the present invention contain highly dispersed amounts of conductive fibers within a polymer matrix and generally exhibit greater shielding properties when compared to conventional electromagnetic shielding composites having the same amount and type of conductive fibers. The improved shielding performance with minimized amounts of conductive fibers is exemplified by FIG. 1. The x-axis of FIG. 1 represents the amount of conductive fibers by wt. % of a composite while the y-axis represents shielding performance of a composite as measured in decibels by ASTM D4935. Plotted on the graph of FIG. 1 are two comparative samples of electromagnetic shielded composites made by conventional means. The comparative samples are made according to the methods outlined under the heading "Comparative Sample" as Examples 32–33 below. A linear fit line is drawn through the plotted comparative samples which includes the point 0,0. Also plotted on the graph of FIG. 1 are two inventive samples of electromagnetic shielded composites made in accordance with the present invention. The inventive samples are made according to the methods outlined under the heading "Inventive Sample" as Examples 30–31 below. As can be seen in the graph of FIG. 1, composites made in accordance with the present invention generally show increased shielding properties at any given fiber content.

In one embodiment of the invention, the pellets useful for making the electromagnetic shielded composites of the present invention are made in accordance the method described below. A conductive fiber strand is placed on a tensioning creel device, such as Unwind Tension Compensator Model No. 800C012 from Compensating Tension Controls Inc (CTC). The fiber strand then passes, under constant tension, through a tube furnace, such as a Type 55035A available from Lindberg of 304 Hart St., Wartertown, Wis. The tube furnace is typically operated at a temperature of 800° F. (427° C.) which imparts sufficient thermal energy to the surface of the fibers to promote wicking of the chemical treatment onto the individual filaments. The heated fibers are then allowed to pass over a chemical treatment application device which may be fabricated by machining an 1/8" (3.175) wide groove into a 6" (15.24 cm) by 1/2" (1.27 cm) by 1" (2.54 cm) piece of brass bar stock. Generally, the groove depth varies from 1/2" (1.27 cm) deep on the ends to 1/4" (0.63 cm) deep in the middle. Typically, at the bottom of the groove are two holes through which the chemical treatment is pumped. One suitable pump is a Zenith model HPB, delivering 0.297 cc per revolution and is available from the Zenith Pumps Division of the Parker Hannifin Corporation, Sanford, N.C. The chemical treatment can be delivered to the applicator via metal piping and can be pumped from a heated reservoir, typically a one-gallon metal paint can on a laboratory hot plate. The chemically treated fiber strand then passes into a single hole extrusion coating die which is supplied with molten thermoplastic, for example, by a model KN-200, 2" (5.08 cm) screw, 100 rpm max extruder available from Killion of Cedar Grove, N.J. Thermoplastic resin supplied to the extruder is then dried preferably using a model N-2 resin-drying oven available from IMS Company of Auburn, Ohio. Once chemically treated fiber strand is encapsulated with molten thermoplastic, it exits the extrusion coating die and immediately enters a 12' (3.66 m) long cooling trough filled with water. The water in this bath is maintained at room temperature or lower with, for example, a model R100 chiller unit available from Haskris of Elk Grove Village, Ill. As the encased strand exits the cooling trough excess water is removed by allowing the thermoplastic encased tow to pass through an air knife, such as a model HV-1 air knife from Berlyn of Worcester, Mass. Pellets are then formed by chopping the wire coated material into discrete 4 millimeter lengths using, for example, a Conair model 204 T chopper available from Conair/Jetro of Bay City, Mich. The pellets are then dried as above before being injection molded into test specimens or finished composite parts.

Suitable conductive fibers for the present invention are available from a number of suppliers. Stainless steel fibers may be obtained from Bekaert Corporation/Bekaert Fibre Technologies Marietta, Ga., product numbers Beki-Shield BU08/5000 CR E, and Beki-Shield BU08/12000 CR E. One type of electroplated metal-coated carbon fibers may be obtained from Composite Material, L.L.C., Mamaroneck, N.Y., product numbers, PPO-1200-NiCuNi, PPO-1200-NiCu, and PPO-1200-Ni. Another type of electroplated metal-coated carbon fiber may be obtained from Toho Carbon Fiber, Inc. Irvine, Calif., product number, G30-500 12K A203 MC. Another type of metal-coated carbon fibers may be obtained from Inco Special Products Wyckoff, N.J., Product Numbers, INCOFIBER® 12K20 Nickel Coated Carbon Fiber, and INCOFIBER®) 12K50 Nickel Coated Carbon Fiber. Carbon fiber is available as Besfight G30-500 HTA 7C NS01 from Toho Carbon Fiber, Inc. Irvine, Calif. or as Grafil 34-700 12K from Grafil Inc. Sacramento, Calif.

Suitable conductive strands for the present invention may be made by conventional methods known in the art. For example, a tow consisting of forty filaments of copper wire was prepared from ten spools of awg-41 bare copper wire available from Elektrisola of Boscawen, N.H., by collecting the ten individual wires from the ten spools into a single tow of ten filaments by winding them onto a single spool. Likewise, four of these tows containing ten filaments each were then collected by winding them together into a single forty-filament tow on a single spool.

EXAMPLES

Testing for electromagnetic interference (EMI) shielding was accomplished according to ASTM D 4935. This requires a test fixture for holding the four inch diameter, injection molded test specimens. A suitable ASTM D4935 specimen holder is commercially available from Electro-Metrics, Inc. of Johnstown, N.Y. A suitable analyzer is HP RF Vector Network Analyzer, commercially available from Agilent Technologies of Englewood, Colo. This provides an average shielding effectiveness number for the frequency range of 30 Mhz–1.2 Ghz. Surface conductivity was measured using the method described in ASTM D257.

The stearate-capped propyleneglycol fumarate oligomer (PGF-ST) chemical treatment used in the examples below was prepared as follows: A ten gallon stainless steel reactor was charged with 8.885 kg of propylene glycol (Ashland Chemical Company, Columbus, Ohio), 8.469 kg of fumaric acid (Huntsman Specialty Chemical), 13.84 Kg of stearic acid (Aldrich Chemical), and 31.19 g of dibutyl tin oxide (DBTO) catalyst, available from Elf Atochem of Philadelphia, Pa. under the trade name Fascat 4201. For stability, 3.51 g, 112.5 ppm of toluhydroquinone (THQ) available from Aldrich Chemical of Milwaukee, Wis. is added to the reactor. The molar ratio of the charge was 4:3:2 propyleneglycol (PG) to fumaric acid (FA) to stearic acid (ST) with 20% additional propylene glycol added to compensate for glycol losses from the distillation column over the course of the reaction. The mixture, under a nitrogen atmosphere, was heated to 390° F. (199° C.) for five hours. The endpoint of the reaction was determined by the viscosity of the stearate-capped, PG-fumarate product which was in the range of 150–190 cps at 50° C. as determined by an ICI cone and plate viscometer. The acid value at the reaction end point was typically observed to be within the range of 0–2 meq KOH/g resin.

Example 1

To a one gallon metal paint can was added 2 Kg of propoxylated bisphenol A. This chemical treatment was then heated in an oven at 130° F. (54.4° C.) for three hours. Once at thermal equilibrium, the container with contents was placed on the hot plate of the process apparatus described in the above general section and the temperature was maintained at 120° F. (48.9° C.). At this temperature, the bis-A-diol had a viscosity of 1 cps. The process parameters were set as follows: puller=30.48 meters per minute; Zenith pump=5.63 grams per minute; extruder 277.48 grams per minute; and chopper=4 mm chop length. The conductive fiber used was Ni Cu Ni with an average yield of 1.42 grams per meter and was heated by passing it through the tube furnace. Under these conditions, 13 Kg of conductive fiber was coated with 1.69 Kg of chemical treatment and the mixture was then encapsulated with 83.24 Kg of thermoplastic resin affording 97.93 Kg of composite pellets having the composition of 13.27% Ni Cu Ni fiber, 1.73% bis-A-diol chemical treatment, and 85% PC-ABS, with the chemically treated metallized fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 48 db as measured by the ASTM D4935 test.

Example 2

To a one gallon metal paint can was added 5 Kg of PGF-ST. This chemical treatment was then heated in an oven at 130° F. (54.4° C.) for three hours. Once at thermal equilibrium, the container with contents was placed on the hot plate of the process apparatus described in the above general section and the temperature was maintained at 120° F. (48.9° C.). At this temperature, the polyester oligomer had a viscosity of 150 cps. The process parameters were set as follows: puller=30.48 meters per minute; Zenith pump=16.5 grams per minute; extruder 357.9 grams per minute; and chopper=4 mm chop length. The conductive fiber used was Ni Cu Ni with an average yield of 1.42 grams per meter and was heated by passing it through the tube furnace. Under these conditions, 13 Kg of conductive fiber was coated with 4.6 Kg of chemical treatment and the mixture was then encapsulated with 99.7 Kg of thermoplastic resin affording 117.3 Kg of composite pellets having the composition of 11.1% Ni Cu Ni fiber, 3.9% PGF-ST chemical treatment, and 85% PC-ABS, with the chemically treated, metallized, fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 22 db as measured by the ASTM D4935 test.

Example 3

To a one gallon metal paint can was added 6 Kg of ethylene carbonate. This chemical treatment was not heated. The container with contents was placed on the hot plate of the process apparatus described in the above general section and the temperature was maintained at room temperature, 70° F. (21.1° C.). At this temperature, the monomer had a viscosity of 1 cps. The process parameters were set as follows: puller=30.48 meters per minute; Zenith pump=19 grams per minute; extruder 376 grams per minute; and chopper=4 mm chop length. The conductive fiber used was Ni Cu Ni with an average yield of 1.55 grams per meter and was not heated. Under these conditions, 13 Kg of conductive fiber was coated with 5.2 Kg of chemical treatment and the mixture was then encapsulated with 103.3 Kg of thermoplastic resin affording 121.5 Kg of composite pellets having the composition of 10.7% Ni Cu Ni fiber, 4.3% ethylene carbonate chemical treatment, and 85% PC-ABS, with the chemically treated, metallized, fiber tow comprising 15% of the finished composite compound. The pellets were of uniform size and shape with the fiber bundle anchored and well centered in the thermoplastic sheath but the quality was not as good as the above two examples. Occasionally some loose filaments would be observed among the bulk pellets The pellets were injection molded at a melt temperature of 570° F. (299° C.) into a tool at 150° F. (65.5° C.). The resulting 4" (10.16 cm) diameter×2 mm disk test specimens had conductive fibers well dispersed throughout the composite. No undispersed bundles of fibers were observed. The composite exhibited a shielding effectiveness value of 49 db as measured by the ASTM D4935 test.

Example 4

A 4.38 molal solution was prepared by adding 1.5 Kg, 6.57 moles of bisphenol-A to 1.5 Kg of bisphenol-A-propoxylate in a one gallon metal paint can. This chemical treatment mixture was then heated in an oven at 130° F. (54.4° C.) for three hours. Once at thermal equilibrium, the container with the now homogeneous chemical treatment was placed on the hot plate of the process apparatus described in the above general section and the temperature was maintained at 120° F. (48.9° C.). At this temperature, the solution had a viscosity of 40 cps. The process parameters were set as follows: puller=30.48 meters per minute; Zenith pump=6.25 grams per minute; extruder 271.53 grams per minute; and chopper=4 mm chop length. The conductive fiber used was Ni Cu with an average yield of 1.37 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni Cu fiber, 1.96% bis-A-diol/bisphenol-A chemical treatment, and 85% PC-ABS, with the chemically treated metallized fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 75 db as measured by the ASTM D4935 test and a surface resistivity of 0.6–52 ohm/sq.

Example 5

A 0.19 molal solution was prepared by adding 1.5 Kg, 0.29 moles of sorbitan monostearate to 1.5 Kg of bisphenol-A-propoxylate in a one gallon metal paint can. This chemical treatment mixture was then heated in an oven at 130° F. (54.4° C.) for three hours. Once at thermal equilibrium, the container with the now homogeneous chemical treatment was placed on the hot plate of the process apparatus described in the above general section and the temperature was maintained at 120° F. (48.9° C.). At this temperature, the solution had a viscosity of 40 cps. The process parameters were set as follows: puller=30.48 meters per minute; Zenith pump=6.25 grams per minute; extruder 271.53 grams per minute; and chopper=4 mm chop length. The conductive fiber used was Ni Cu with an average yield of 1.37 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni Cu fiber, 1.96% bis-A-diol/sorbitan monostearate chemical treatment, and 85% PC-ABS, with the chemically treated metallized fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 75 db as measured by the ASTM D4935 test.

Example 6

To a one gallon metal paint can was added 4 Kg of castor oil. This chemical treatment was not heated. The container with contents was placed on the hot plate of the process apparatus described in the above general section and the temperature was maintained at room temperature, 70° F. (21.1° C.). At this temperature, the monomer had a viscosity of 1 cps. The process parameters were set as follows: puller=30.48 meters per minute; Zenith pump=10 grams per minute; extruder 308 grams per minute; and chopper=4 mm chop length. The conductive fiber used was Ni Cu Ni with an average yield of 1.45 grams per meter and was not heated. Under these conditions, 13 Kg of conductive fiber was coated with 2.93 Kg of chemical treatment and the mixture was then encapsulated with 90.24 Kg of thermoplastic resin affording 106.17 Kg of composite pellets having the composition of 12.2% Ni Cu Ni fiber, 2.8% castor oil chemical treatment, and 85% polycarbonate, with the chemically treated, metallized, fiber tow comprising 15% of the finished composite compound. The pellets were of uniform size and shape with the fiber bundle anchored and well centered in the thermoplastic sheath but the quality was not as good as the above two examples. Occasionally some loose filaments would observed among the bulk pellets The pellets were injection molded at a melt temperature of 580° F. into a tool at 180° F. (82.2° C.). The resulting 4" (10.16 cm) diameter×1 mm disk test specimens had conductive fibers well dispersed throughout the composite. No undispersed bundles of fibers were observed. The composite exhibited a shielding effectiveness value of 13 db as measured by the ASTM D4935 test.

Example 7

A 1.30 molal solution was prepared by adding 0.6 Kg, 3.12 moles of citric acid to 2.4 Kg of bisphenol-A-propoxylate in a one gallon metal paint can. This chemical treatment mixture was then heated in an oven at 130° F. (54.4° C.) for three hours. Once at thermal equilibrium, the container with the now homogeneous chemical treatment was placed on the hot plate of the process apparatus described in the above general section and the temperature was maintained at 120° F. (48.9° C.). At this temperature, the solution had a viscosity of 3 cps. The process parameters were set as follows: puller=30.48 meters per minute; Zenith pump=5.75 grams per minute; extruder 250 grams per minute; and chopper=4 mm chop length. The conductive fiber used was Ni Cu with an average yield of 1.26 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni Cu fiber, 1.96% bis-A-diol/citric acid chemical treatment, and 85% polycarbonate, with the chemically treated metallized fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 81 db as measured by the ASTM D4935 test and a surface resistivity of 0.2–93 ohm/sq.

Example 8

A 0.19 molal solution was prepared by adding 1.5 Kg, 0.29 moles of sorbitan monostearate to 1.5 Kg of bisphenol-A-propoxylate in a one gallon metal paint can. This chemical treatment mixture was then heated in an oven at 130° F. (54.4° C.) for three hours. Once at thermal equilibrium, the container with the now homogeneous chemical treatment was placed on the hot plate of the process apparatus described in the above general section and the temperature was maintained at 120° F. (48.9° C.). At this temperature, the solution had a viscosity of 40 cps. The process parameters were set as follows: puller=30.48 meters per minute; Zenith pump=6.25 grams per minute; extruder 271.53 grams per minute; and chopper=4 mm chop length. The conductive fiber used was Ni Cu with an average yield of 1.37 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni Cu fiber, 1.96% bis-A-diol/sorbitan monostearate chemical treatment, and 85% polycarbonate, with the chemically treated metallized fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 82 db as measured by the ASTM D4935 test and a surface resistivity of 0.4–11.1 ohm/sq.

Example 9

To a one gallon metal paint can was added 3 Kg of sorbitan monostearate. This chemical treatment was then heated in an oven at 130° F. (54.4° C.) for three hours. Once at thermal equilibrium, the container with contents was placed on the hot plate of the process apparatus described in the above general section and the temperature was maintained at 120° F. (48.9° C.). At this temperature, the sorbitan monostearate had a viscosity of 1 cps. The process parameters were set as follows: puller=30.48 meters per minute; Zenith pump=7 grams per minute; extruder 304.1 grams per minute; and chopper=4 mm chop length. The conductive fiber used was Ni Cu with an average yield of 1.42 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni Cu fiber, 1.96% sorbitan monostearate chemical treatment, and 85% polycarbonate, with the chemically treated metallized fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 84 db as measured by the ASTM D4935 test and a surface resistivity of 0.2–1.2 ohm/sq.

Example 10

To a one gallon metal paint can was added 4 Kg of mineral oil. This chemical treatment was not heated. The container with contents was placed on the hot plate of the process apparatus described in the above general section and the temperature was maintained at room temperature, 70° F. (21.1° C.). At this temperature, the monomer had a viscosity of less than 1 cps. The process parameters were set as follows: puller=30.48 meters per minute; Zenith pump=9.6 grams per minute; extruder 313.2 grams per minute; and chopper=4 mm chop length. The conductive fiber used was Ni Cu Ni with an average yield of 1.50 grams per meter and was not heated. Under these conditions, 13 Kg of conductive fiber was coated with 2.73 Kg of chemical treatment and the mixture was then encapsulated with 89.15 Kg of thermoplastic resin affording 104.9 Kg of composite pellets having the composition of 12.4% Ni Cu Ni fiber, 2.6% mineral oil chemical treatment, and 85% polybutyleneterephthalate, with the chemically treated, metallized, fiber tow comprising 15% of the finished composite compound. The pellets were of uniform size and shape with the fiber bundle anchored and well centered in the thermoplastic sheath but the quality was not as good as the following two examples. Occasionally some loose filaments would observed among the bulk pellets The pellets were injection molded at a melt temperature of 560° F. (293° C.) into a tool at 180° F. (82.2° C.). The resulting 4" (10.16 cm) diameter×1 mm disk test specimens had conductive fibers well dispersed throughout the composite. No undispersed bundles of fibers were observed. The composite exhibited a shielding effectiveness value of 21 db as measured by the ASTM D4935 test.

Example 11

A 0.19 molal solution was prepared by adding 1.5 Kg, 0.29 moles of sorbitan monostearate to 1.5 Kg of bisphenol-A-propoxylate in a one gallon metal paint can. This chemical treatment mixture was then heated in an oven at 130° F. (54.4° C.) for three hours. Once at thermal equilibrium, the container with the now homogeneous chemical treatment was placed on the hot plate of the process apparatus described in the above general section and the temperature was maintained at 120° F. (48.9° C.). At this temperature, the solution had a viscosity of less than 1 cps. The process parameters were set as follows: puller=30.48 meters per minute; Zenith pump=6.25 grams per minute; extruder 271.53 grams per minute; and chopper 4 mm chop length. The conductive fiber used was Ni Cu with an average yield of 1.37 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni Cu fiber, 1.96% bis-A-diol/sorbitan monostearate chemical treatment, and 85% polybutyleneterephthalate, with the chemically treated metallized fiber tow comprising 15% of the finished composite compound. The pellets were of uniform size and shape with the fiber bundle anchored and well centered in the thermoplastic sheath. The pellets were injection molded at a melt temperature of 560° F. (293° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 71 db as measured by the ASTM D4935 test and a surface resistivity of 0.9–35 ohm/sq.

Example 12

To a one gallon metal paint can was added 3 Kg of butoxyethylstearate. This chemical treatment was then heated in an oven at 130° F. (54.4° C.) for three hours. Once at thermal equilibrium, the container with contents was placed on the hot plate of the process apparatus described in the above general section and the temperature was maintained at 120° F. (48.9° C.). At this temperature, the sorbitan monostearate had a viscosity of less than 1 cps. The process parameters were set as follows: puller=30.48 meters per minute; Zenith pump=7 grams per minute; extruder 304.1 grams per minute; and chopper=4 mm chop length. The conductive fiber used was Ni Cu with an average yield of 1.53 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni Cu fiber, 1.96% butoxyethylstearate chemical treatment, and 85% polybutyleneterephthalate, with the chemically treated metallized fiber tow comprising 15% of the finished composite compound. The pellets were of uniform size and shape with the fiber bundle anchored and well centered in the thermoplastic sheath. The pellets were injection molded at a melt temperature of 560° F. (293° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 73 db as measured by the ASTM D4935 test and a surface resistivity of 4.4–999 ohm/sq.

Example 13

To a one gallon metal paint can was added 3 Kg of hydrogenated vegetable oil. This chemical treatment was then heated in an oven at 130° F. (54.4° C.) for three hours. Once at thermal equilibrium, the container with contents was placed on the hot plate of the process apparatus described in the above general section and the temperature was maintained at 120° F. (48.9° C.). At this temperature, the hydrogenated vegetable oil had a viscosity of less than 1 cps. The process parameters were set as follows: puller=30.48 meters per minute; Zenith pump=6.6 grams per minute; extruder 286.7 grams per minute; and chopper=4 mm chop length. The conductive fiber used was Ni Cu with an average yield of 1.44 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni Cu fiber, 1.96% hydrogenated vegetable oil chemical treatment, and 85% polybutyleneterephthalate, with the chemically treated metallized fiber tow comprising 15% of the finished composite compound. The pellets were of uniform size and shape with the fiber bundle anchored and well centered in the thermoplastic sheath. The pellets were injection molded at a melt temperature of 560° F. (293° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 79 db as measured by the ASTM D4935 test and a surface resistivity of 1.2–41 ohm/sq.

Example 14

To a one gallon metal paint can was added 5 Kg of ethylene carbonate. This chemical treatment was not heated. The container with contents was placed on the hot plate of the process apparatus described in the above general section and the temperature was maintained at room temperature, 70° F. (21.1° C.). At this temperature, the monomer had a viscosity of less than 1 cps. The process parameters were set as follows: puller=30.48 meters per minute; Zenith pump=17 grams per minute; extruder 365 grams per minute; and chopper=4 mm chop length. The conductive fiber used was Ni Cu Ni with an average yield of 1.55 grams per meter and was not heated. Under these conditions, 13 Kg of conductive fiber was coated with 4.7 Kg of chemical treatment and the mixture was then encapsulated with 100.1 Kg of thermoplastic resin affording 121.5 Kg of composite pellets having the composition of 11% Ni Cu Ni fiber, 4% ethylene carbonate chemical treatment, and 85% polypropylene, with the chemically treated, metallized, fiber tow comprising 15% of the finished composite compound. The pellets were of uniform size and shape with the fiber bundle anchored and well centered in the thermoplastic sheath but the quality was not as good as the above Example 13. Occasionally some loose filaments would observed among the bulk pellets The pellets were injection molded at a melt temperature of 535° F. (279° C.) into a tool at 130° F. (54.4° C.). The resulting 4" (10.16 cm) diameter×2 mm disk test specimens had conductive fibers well dispersed throughout the composite. No undispersed bundles of fibers were observed. The composite exhibited a shielding effectiveness value of 70 db as measured by the ASTM D4935 test and a surface resistivity of 5–25 ohm/sq.

Example 15

A 1.30 molal solution was prepared by adding 0.6 Kg, 3.12 moles of citric acid to 2.4 Kg of bisphenol-A-propoxylate in a one gallon metal paint can. This chemical treatment mixture was then heated in an oven at 130° F. (54.4° C.) for three hours. Once at thermal equilibrium, the container with the now homogeneous chemical treatment was placed on the hot plate of the process apparatus described in the above general section and the temperature was maintained at 120° F. (48.9° C.). At this temperature, the solution had a viscosity of 3 cps. The process parameters were set as follows: puller=30.48 meters per minute; Zenith pump=6.65 grams per minute; extruder 289 grams per minute; and chopper=4 mm chop length. The conductive fiber used was Ni Cu with an average yield of 1.45 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni Cu fiber, 1.96% bis-A-diol/citric acid chemical treatment, and 85% polypropylene, with the chemically treated metallized fiber tow comprising 15% of the finished composite compound. The pellets were of uniform size and shape with the fiber bundle anchored and well centered in the thermoplastic sheath. The pellets were injection molded at a melt temperature of 535° F. (279° C.) into a tool at 130° F. (54.4° C.). The resulting 4" (10.16 cm) diameter×1 mm disk test specimens had conductive fibers well dispersed throughout the composite. No undispersed bundles of fibers were observed. The composite exhibited a shielding effectiveness value of 85 db as measured by the ASTM D4935 test and a surface resistivity of 0.6–9.6 ohm/sq.

Example 16

A 2.19 molal solution was prepared by adding 0.75 Kg, 3.29 moles of bisphenol-A to 2.25 Kg of bisphenol-A-propoxylate in a one gallon metal paint can. This chemical treatment mixture was then heated in an oven at 330° F. (165° C.) for three hours. Once at thermal equilibrium, the container with the now homogeneous chemical treatment was placed on the hot plate of the process apparatus described in the above general section and the temperature was maintained at 120° F. (48.9° C.). At this temperature, the solution had a viscosity of less than 1 cps. The process parameters were set as follows: puller=30.48 meters per minute; Zenith pump=6.65 grams per minute; extruder 289 grams per minute; and chopper=4 mm chop length. The conductive fiber used was Ni Cu with an average yield of 1.45 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni Cu fiber, 1.96% bis-A-diol/bisphenol-A chemical treatment, and 85% Nylon, with the chemically treated metallized fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 77 db as measured by the ASTM D4935 test and a surface resistivity of 2.9–450 ohm/sq.

Example 17

To a one gallon metal paint can was added 4 Kg of PGF-ST. This chemical treatment was then heated in an oven at 130° F. (54.4° C.) for three hours. Once at thermal equilibrium, the container with contents was placed on the hot plate of the process apparatus described in the above general section and the temperature was maintained at 120° F. (48.9° C.). At this temperature, the polyester oligomer had a viscosity of 30 cps. The process parameters were set as follows: puller=30.48 meters per minute; Zenith pump=13 grams per minute; extruder 338 grams per minute; and chopper=4 mm chop length. The conductive fiber used was Ni Cu Ni with an average yield of 1.53 grams per meter and was heated by passing it through the tube furnace. Under these conditions, 13 Kg of conductive fiber was coated with 3.62 Kg of chemical treatment and the mixture was then encapsulated with 94.2 Kg of thermoplastic resin affording 110.8 Kg of composite pellets having the composition of 11.7% Ni Cu Ni fiber, 3.3% PGF-ST chemical treatment, and 85% ABS, with the chemically treated, metallized, fiber tow comprising 15% of the finished composite compound. The pellets were of uniform size and shape with the fiber bundle anchored and well centered in the thermoplastic sheath. The pellets were injection molded at a melt temperature of 490° F. (254.4° C.) into a tool at 150° F. (65.5° C.). The resulting 4" (10.16 cm) diameter×2 mm disk test specimens had conductive fibers well dispersed throughout the composite. No undispersed bundles of fibers were observed. The composite exhibited a shielding effectiveness value of 68 db as measured by the ASTM D4935 test.

Example 18

To a one gallon metal paint can was added 5 Kg of PGF-ST. This chemical treatment was then heated in an oven at 130° F. (54.4° C.) for three hours. Once at thermal equilibrium, the container with contents was placed on the hot plate of the process apparatus described in the above general section and the temperature was maintained at 120° F. (48.9° C.). At this temperature, the polyester oligomer had a viscosity of 30 cps. The process parameters were set as follows: puller=30.48 meters per minute; Zenith pump=16.4 grams per minute; extruder 375 grams per minute; and chopper=4 mm chop length. The conductive fiber used was Ni Cu Ni with an average yield of 1.63 grams per meter and was heated by passing it through the tube furnace. Under these conditions, 13 Kg of conductive fiber was coated with 4.32 Kg of chemical treatment and the mixture was then encapsulated with 98.1 Kg of thermoplastic resin affording 115.4 Kg of composite pellets having the composition of 11.3% Ni Cu Ni fiber, 3.7% PGF-ST chemical treatment, and 85% polyethyleneterephthalate, with the chemically treated, metallized, fiber tow comprising 15% of the finished composite compound. The pellets were of uniform size and shape with the fiber bundle anchored and well centered in the thermoplastic sheath. The pellets were injection molded at a melt temperature of 560° F. (293° C.) into a tool at 180° F. (82.2° C.). The resulting 4" (10.16 cm) diameter×2 mm disk test specimens had conductive fibers well dispersed throughout the composite. No undispersed bundles of fibers were observed. The composite exhibited a shielding effectiveness value of 82 db as measured by the ASTM D4935 test and a surface resistivity of 2–5 ohm/sq.

Example 19

To a one gallon metal paint can was added 5 Kg of ethylene carbonate. This chemical treatment was not heated. The container with contents was placed on the hot plate of the process apparatus described in the above general section and the temperature was maintained at room temperature, 70° F. (21.1° C.). At this temperature, the monomer had a viscosity of 1 cps. The process parameters were set as follows: puller=30.48 meters per minute; Zenith pump=16 grams per minute; extruder 332 grams per minute; and chopper=4 mm chop length. The conductive fiber used was Ni Cu Ni with an average yield of 1.40 grams per meter and was not heated. Under these conditions, 13 Kg of conductive fiber was coated with 4.9 Kg of chemical treatment and the mixture was then encapsulated with 101.3 Kg of thermoplastic resin affording 119.1 Kg of composite pellets having the composition of 10.9% Ni Cu Ni fiber, 4.1% ethylene carbonate chemical treatment, and 85% HIPS, with the chemically treated, metallized, fiber tow comprising 15% of the finished composite compound. The pellets were of uniform size and shape with the fiber bundle anchored and well centered in the thermoplastic sheath but the quality was not as good as the above two examples. Occasionally some loose filaments would observed among the bulk pellets The pellets were injection molded at a melt temperature of 570° F. (299° C.) into a tool at 150° F. (65.5° C.). The resulting 4" (10.16 cm) diameter×2 mm disk test specimens had conductive fibers moderately well dispersed throughout the composite. Occasional undispersed bundles of fibers were observed. The composite exhibited a shielding effectiveness value of 73 db as measured by the ASTM D4935 test and a surface resistivity of 8–50 ohm/sq.

Example 20

A 4.38 molal solution was prepared by adding 1.5 Kg, 6.57 moles of bisphenol-A to 1.5 Kg of bisphenol-A-propoxylate in a one gallon metal paint can. This chemical treatment mixture was then heated in an oven at 130° F. (54.4° C.) for three hours. Once at thermal equilibrium, the container with the now homogeneous chemical treatment was placed on the hot plate of the process apparatus described in the above general section and the temperature was maintained at 120° F. (48.9° C.). At this temperature, the solution had a viscosity of 40 cps. The process parameters were set as follows: puller=30.48 meters per minute; Zenith pump=6.75 grams per minute; extruder 293.25 grams per minute; and chopper=4 mm chop length. The conductive fiber used was stainless steel with an average yield of 1.48 grams per meter and was heated by passing it through the tube furnace. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% stainless steel fiber, 1.96% bis-A-diol bisphenol-A chemical treatment, and 85% PC-ABS, with the chemically treated metallized fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 53 db as measured by the ASTM D4935 test and a surface resistivity of greater than 20 ohm/sq.

Example 21

Using the same chemical treatment and conductive fiber as in Example 20, a sample containing a lower concentration of conductive fiber may be prepared by setting the process parameters as follows: puller=30.48 meters per minute; Zenith pump=6.75 grams per minute; extruder 465.75 grams per minute; and chopper=4 mm chop length. Under these conditions, 8.7 Kg of conductive fiber was coated with 1.31 Kg of chemical treatment and the mixture was then encapsulated with 90.05 Kg of thermoplastic resin affording 100.05 Kg of composite pellets having the composition of 8.7% stainless steel fiber, 1.3% bis-A-diol/bisphenol-A chemical treatment, and 90% PC-ABS, with the chemically treated metallized fiber tow comprising 10% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 45 db as measured by the ASTM D4935.

Example 22

Plated nickel coated carbon conductive fiber, having an average yield of 1.39 grams per meter, was processed as described in Example 20. The process parameters were set as follows: puller=30.48 meters per minute; Zenith pump=6.35 grams per minute; extruder 275.87 grams per minute; and chopper=4 mm chop length. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% Ni-C fiber, 1.96% bis-A-diol/bisphenol-A chemical treatment, and 85% PC-ABS, with the chemically treated metallized fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 74 db as measured by the ASTM D4935 test and a surface resistivity of 1–14 ohm/sq.

Example 23

Using the same chemical treatment and conductive fiber as in Example 20, a sample containing a lower concentration of conductive fiber may be prepared by setting the process parameters as follows: puller=30.48 meters per minute; Zenith pump=6.35 grams per minute; extruder 438.15 grams per minute; and chopper=4 mm chop length. Under these conditions, 8.69 Kg of conductive fiber was coated with 1.31 Kg of chemical treatment and the mixture was then encapsulated with 90.05 Kg of thermoplastic resin affording 100.05 Kg of composite pellets having the composition of 8.7% conductive fiber, 1.3% bis-A-diol/bisphenol-A chemical treatment, and 90% PC-ABS, with the chemically treated metallized fiber tow comprising 10% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 61 db as measured by the ASTM D4935.

Example 24

Chemical Vapor Deposited (CVD) nickel coated carbon conductive fiber, having an average yield of 2.01 grams per meter, was processed as described in Example 20. The process parameters were set as follows: puller 30.48 meters per minute; Zenith pump=9.3 grams per minute; extruder 399.69 grams per minute; and chopper=4 mm chop length. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% CVD-Ni—C fiber, 1.96% bis-A-diol/bisphenol-A chemical treatment, and 85% PC-ABS, with the chemically treated metallized fiber tow comprising 15% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 80 db as measured by the ASTM D4935 test and a surface resistivity of 0.3–48 ohm/sq.

Example 25

Using the same chemical treatment and conductive fiber as in Example 24, a sample containing a lower concentration of conductive fiber may be prepared by setting the process parameters as follows: puller=30.48 meters per minute; Zenith pump=9.2 grams per minute; extruder 634.8 grams per minute; and chopper=4 mm chop length. Under these conditions, 8.69 Kg of conductive fiber was coated with 1.31

Kg of chemical treatment and the mixture was then encapsulated with 90.05 Kg of thermoplastic resin affording 100.05 Kg of composite pellets having the composition of 8.7% CVD-Ni—C fiber, 1.3% bis-A-diol/bisphenol-A chemical treatment, and 90% PC-ABS, with the chemically treated metallized fiber tow comprising 10% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 73 db as measured by the ASTM D4935.

Example 26

Using the same chemical treatment as in Example 4, and Ni Cu conductive fiber of average yield 1.36 grams per meter, a sample containing a lower concentration of conductive fiber may be prepared by setting the process parameters as follows: puller=30.48 meters per minute; Zenith pump=6.2 grams per minute; extruder 427.8 grams per minute; and chopper=4 mm chop length. Under these conditions, 8.69 Kg of conductive fiber was coated with 1.31 Kg of chemical treatment and the mixture was then encapsulated with 90.05 Kg of thermoplastic resin affording 100.05 Kg of composite pellets having the composition of 8.7% conductive fiber, 1.3% bis-A-diol/bisphenol-A chemical treatment, and 90% PC-ABS, with the chemically treated metallized fiber tow comprising 10% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 71 db as measured by the ASTM D4935.

Example 27

An experimental tow of 40 copper wire filaments, having an average yield of 1.36 grams per meter, was processed as described in Example 4. The process parameters were set as follows: puller=30.48 meters per minute; Zenith pump=6.2 grams per minute; extruder 269.36 grams per minute; and chopper=4 mm chop length. Under these conditions, 13 Kg of conductive fiber was coated with 1.95 Kg of chemical treatment and the mixture was then encapsulated with 84.72 Kg of thermoplastic resin affording 99.67 Kg of composite pellets having the composition of 13.04% copper fiber, 1.96% bis-A-diol/bisphenol-A chemical treatment, and 85% PC-ABS, with the chemically treated metallized fiber tow comprising 15% of the finished composite compound. The pellets were of uniform size and shape with the fiber bundle anchored but not well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 14 db.

Example 28

Using the same chemical treatment as in Example 16, and carbon fiber of average yield 0.82 grams per meter, a sample containing a very low concentration of conductive fiber may be prepared by setting the process parameters as follows: puller=30.48 meters per minute; Zenith pump=6.3 grams per minute; extruder 1010.4 grams per minute; and chopper=4 mm chop length. Under these conditions, 4.8 Kg of conductive fiber was coated with 1.2 Kg of chemical treatment and the mixture was then encapsulated with 194 Kg of thermoplastic resin affording 200 Kg of composite pellets having the composition of 2.4% conductive fiber, 0.6% bis-A-diol/bisphenol-A chemical treatment, and 97% PC-ABS, with the chemically treated carbon fiber tow comprising 3% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×2 mm disk test specimens had conductive fibers well dispersed throughout the composite. No undispersed bundles of fibers were observed. The composite exhibited a shielding effectiveness value of 17 db as measured by the ASTM D4935 and a surface resistivity of 600–7000 ohm/sq.

Example 29

Using the same chemical treatment as in Example 16, and carbon fiber of average yield 0.82 grams per meter, a sample containing a high concentration of conductive fiber may be prepared by setting the process parameters as follows: puller=30.48 meters per minute; Zenith pump=6.3 grams per minute; extruder 125 grams per minute; and chopper=4 mm chop length. Under these conditions, 16 Kg of conductive fiber was coated with 4 Kg of chemical treatment and the mixture was then encapsulated with 80 Kg of thermoplastic resin affording 100 Kg of composite pellets having the composition of 16% conductive fiber, 4% bis-A-diol/bisphenol-A chemical treatment, and 80% PC-ABS, with the chemically treated carbon fiber tow comprising 20% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×2 mm disk test specimens had conductive fibers well dispersed throughout the composite. No undispersed bundles of fibers were observed. The composite exhibited a shielding effectiveness value of 56 db as measured by the ASTM D4935 and a surface resistivity of 3–8 ohm/sq.

Example 30 (Inventive Sample 15% Fiber)

A 4.38 molal solution was prepared by adding 1.5 Kg, 6.57 moles of bisphenol-A to 1.5 Kg of bisphenol-A-propoxylate in a one gallon metal paint can. This chemical treatment mixture was then heated in an oven at 130° F. (54.4° C.) for three hours. Once at thermal equilibrium, the container with the now homogeneous chemical treatment was placed on the hot plate of the process apparatus described in the above general section and the temperature was maintained at 120° F. (48.9° C.). At this temperature, the solution had a viscosity of 40 cps. The process parameters were set as follows: puller=30.48 meters per minute; Zenith pump=9.20 grams per minute; extruder 337.17 grams per minute; and chopper=4 mm chop length. The conductive fiber used was nickel plated carbon fiber with an average yield of 2.01 grams per meter and was heated by passing it through the tube furnace. Under these conditions, 13 Kg of nickel coated carbon conductive fiber was coated with 1.95 Kg of chemical treatment and the mixture was then encapsulated with 71.47 Kg of thermoplastic resin affording 86.40 Kg of composite pellets having the composition of 15.04% nickel coated carbon fiber, 2.26% bis-A-diol/bisphenol-A chemical treatment, and 82.7% PC-ABS, with the chemically treated metallized fiber tow comprising 17.3% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 80 db as measured by the ASTM D4935 test and a surface resistivity of less than 3.1 ohm/sq.

Example 31 (Inventive Sample 10% Fiber)

A 4.38 molal solution was prepared by adding 1.5 Kg, 6.57 moles of bisphenol-A to 1.5 Kg of bisphenol-A-propoxylate in a one gallon metal paint can. This chemical treatment mixture was then heated in an oven at 130° F. (54.4° C.) for three hours. Once at thermal equilibrium, the container with the now homogeneous chemical treatment was placed on the hot plate of the process apparatus described in the above general section and the temperature was maintained at 120° F. (48.9° C.). At this temperature, the solution had a viscosity of 40 cps. The process parameters were set as follows: puller=30.48 meters per minute; Zenith pump=9.20 grams per minute; extruder 542.8 grams per minute; and chopper=4 mm chop length. The conductive fiber used was nickel plated carbon fiber with an average yield of 2.01 grams per meter and was heated by passing it through the tube furnace. Under these conditions, 8.7 Kg of nickel coated carbon conductive fiber was coated with 1.31 Kg of chemical treatment and the mixture was then encapsulated with 77.0 Kg of thermoplastic resin affording 87.0 Kg of composite pellets having the composition of 10.0% nickel coated carbon fiber, 1.5% bis-A-diol/bisphenol-A chemical treatment, and 88.5% PC-ABS, with the chemically treated metallized fiber tow comprising 11.5% of the finished composite compound. The pellets were of uniform size and shape with the fiber bundle anchored and well centered in the thermoplastic sheath. The pellets were injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 60 db as measured by the ASTM D4935 test and a surface resistivity of less than 3.1 ohm/sq.

Example 32 (Comparative Sample 15% Fiber)

The material used for this example is INCOSHIELD™ PMMA Long Fiber Nickel Concentrate available from Inco Special Products, 681 Lawlins Rd., Wyckoff, N.J. 07481. Following the product literature instructions, 1.13 Kg of the long fiber nickel concentrate was mixed with 3.4 Kg of dried PC/ABS in Littleford Mixer model FM-130D, available from Littleford Bros., Inc. of Florence, Ky. 41042. The pellet mixture was injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 64 db as measured by the ASTM D4935 test and a surface resistivity of less than 21 ohm/sq.

Example 33 (Comparative Sample—10% Fiber)

As above, the material used for this example is INCOSHIELD™ PMMA Long Fiber Nickel Concentrate available from Inco Special Products, 681 Lawlins Rd., Wyckoff, N.J. 07481. Following the product literature instructions, 0.758 Kg of the long fiber nickel concentrate was mixed with 3.8 Kg of dried PC/ABS in Littleford Mixer model FM-130D, available from Littleford Bros., Inc. of Florence, Ky. 41042. The pellet mixture was injection molded at a melt temperature of 570° F. (299° C.) into a tool at 150° F. (65.5° C.). The resulting 4" (10.16 cm) diameter×1 mm disk test specimens had conductive fibers well dispersed throughout the composite. No undispersed bundles of fibers were observed. The composite exhibited a shielding effectiveness value of 42 db as measured by the ASTM D4935 test and a surface resistivity of less than 1000 ohm/sq.

While preferred embodiments have been shown and described herein, it should be understood that a number of changes and modifications are possible therein. Accordingly, it is to be understood that there is no intention to limit the invention to the precise construction disclosed herein, and the right is reserved to all changes and modifications coming within the scope of the invention as defined in the appended claims.

We claim:

1. A plurality of pellets capable of being consolidated into an electrically shielded composite wherein said pellets comprise a core of conductive fibers; wherein said core has a coating comprising an organic material having a viscosity at a temperature range of from 80° C.–180° C. no greater than 200 cps.

2. The pellets of claim 1 wherein the pellets are capable of being consolidated into a composite without the addition of any other material.

3. The pellets of claim 1 wherein the pellets have an average length of between 2 mm to 12 mm.

4. The pellets of claim 1 wherein the organic material comprises monomers or oligomers or mixtures thereof.

5. The pellets of claim 1 wherein the organic material is chosen from the group consisting of bisphenol A, propoxylated bisphenol A, diphenyl ether, diphenyl sulfone, stilbene, diglycidyl ether of bisphenol A, triglycidylisocyanurate, citric acid, pentaerythritol, dicyandiimide, 4,4'-sulfonyldianiline, 3,3'-sulfonyldianiline, stearate-capped propyleneglycol fumarate oligomer, butoxyethylstearate, ethylene carbonate, sorbitan monostearate, hydrogenated vegetable oil, and mixtures thereof.

6. The pellets of claim 1 wherein the polymer is a thermoset or thermoplastic polymer.

7. The composite of claim 1 wherein the polymer is chosen from the group consisting of polycarbonate, acrylonitrile butadiene styrene, polycarbonate acrylonitrile butadiene styrene copolymer, polybutylene terephthalate, styrene, polypropylene, and nylon.

8. The pellets of claim 1 wherein the core comprises chosen from the group consisting of carbon fiber, metalized carbon fiber, metalized glass fiber, metal fiber, metal alloy fiber and mixtures thereof.

9. A plurality of pellets capable of being consolidated into an electrically shielded composite wherein said pellets comprise a core of conductive fibers; wherein said core has a coating comprising an organic material having a viscosity at a temperature range of from 80° C.–180° C. no greater than 1500 cps, wherein the organic material comprises a monomer.

10. The pellets of claim 9 wherein the pellets are capable of being consolidated into a composite without the addition of any other material.

11. The pellets of claim 9 wherein the pellets have an average length of between 2 mm to 12 mm.

12. The pellets of claim 9 wherein the core is a strand comprising bundles of at least 40 conductive fibers.

13. The pellets of claim 9 wherein the organic material has a viscosity at a temperature range of from 80° C.–180° C. no greater than 400 cps.

14. The pellets of claim 9 wherein the organic material has a viscosity at a temperature range of from 80° C.–180° C. no greater than 200 cps.

15. The pellets of claim 9 wherein the organic material has a viscosity at a temperature range of from 80° C.–180° C. no greater than 75 cps.

16. The pellets of claim 9 wherein the organic material has a viscosity at a temperature range of from 80° C.–180° C. no greater than 5 cps.

17. The pellets of claim 9 wherein the organic material is chosen from the group consisting of bisphenol A, propoxylated bisphenol A, diphenyl ether, diphenyl sulfone, stilbene, diglycidyl ether of bisphenol A, triglycidylisocyanurate, citric acid, pentaerythritol, dicyandiimide, 4,4'-sulfonyldianiline, 3,3'-sulfonyldianiline, butoxyethylstearate, ethylene carbonate, sorbitan monostearate, hydrogenated vegetable oil, and mixtures thereof.

18. The pellets of claim 9 wherein the polymer is a thermoset or thermoplastic polymer.

19. The composite of claim 9 wherein the polymer is chosen from the group consisting of polycarbonate, acrylonitrile butadiene styrene, polycarbonate acrylonitrile butadiene styrene copolymer, polybutylene terephthalate, styrene, polypropylene, and nylon.

* * * * *